United States Patent
Tenno

(10) Patent No.: US 11,824,251 B2
(45) Date of Patent: Nov. 21, 2023

(54) ANTENNA INSTALLATION STRUCTURE AND ELECTRONIC DEVICE

(71) Applicant: Murata Manufacturing Co., Ltd., Nagaokakyo (JP)

(72) Inventor: Nobuyuki Tenno, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 196 days.

(21) Appl. No.: 17/574,605

(22) Filed: Jan. 13, 2022

(65) Prior Publication Data

US 2022/0140464 A1    May 5, 2022

Related U.S. Application Data

(63) Continuation of application No. PCT/JP2020/035373, filed on Sep. 18, 2020.

(30) Foreign Application Priority Data

Sep. 26, 2019  (JP) .................................. 2019-174858

(51) Int. Cl.
*H01Q 1/12* (2006.01)
*H05K 1/02* (2006.01)

(52) U.S. Cl.
CPC ............. *H01Q 1/12* (2013.01); *H05K 1/0237* (2013.01); *H05K 2201/10098* (2013.01)

(58) Field of Classification Search
CPC ........ H01Q 1/12; H01Q 1/405; H01Q 9/0407; H01Q 1/38; H01Q 1/22; H01Q 1/48; H05K 1/0237; H05K 2201/10098; H05K 1/0225; H05K 1/118; H05K 2201/058; H05K 2201/068; H05K 2201/09336;
(Continued)

(56) References Cited

U.S. PATENT DOCUMENTS

| | | | |
|---|---|---|---|
| 2017/0012339 A1* | 1/2017 | Ito | .......................... G06K 19/077 |
| 2018/0213641 A1* | 7/2018 | Hosoda | .................... H05K 3/46 |
| 2021/0083390 A1* | 3/2021 | Yazaki | ............. G06K 19/07798 |

FOREIGN PATENT DOCUMENTS

| | | |
|---|---|---|
| JP | 2002-299924 A | 10/2002 |
| JP | 2012-231386 A | 11/2012 |
| JP | 2013-126008 A | 6/2013 |

(Continued)

OTHER PUBLICATIONS

Official Communication issued in International Patent Application No. PCT/JP2020/035373, dated Dec. 1, 2020.

*Primary Examiner* — Seung H Lee
(74) *Attorney, Agent, or Firm* — KEATING & BENNETT, LLP

(57) ABSTRACT

An antenna installation structure includes an antenna substrate, an insulation layer, and a bonding material. The antenna substrate includes a dielectric base including first and second main surfaces, and an antenna conductor on the first main surface. The insulation layer is on the first main surface of the antenna substrate. The bonding material is between the insulation layer and a radiation side wall of a housing, is cured, and bonds the insulation layer to the radiation side wall. A linear expansion coefficient of the insulation layer is lower than a linear expansion coefficient of the bonding material and higher than a linear expansion coefficient of the antenna substrate.

20 Claims, 3 Drawing Sheets

(58) Field of Classification Search
CPC . H05K 2201/09618; H05K 2201/0969; H05K 1/147
See application file for complete search history.

(56) References Cited

FOREIGN PATENT DOCUMENTS

| | | |
|---|---|---|
| WO | 2017/069216 A1 | 4/2017 |
| WO | 2017/159024 A1 | 9/2017 |

* cited by examiner

ANTENNA INSTALLATION STRUCTURE AND ELECTRONIC DEVICE

CROSS REFERENCE TO RELATED APPLICATIONS

This application claims the benefit of priority to Japanese Patent Application No. 2019-174858 filed on Sep. 26, 2019 and is a Continuation Application of PCT Application No. PCT/JP2020/035373 filed on Sep. 18, 2020. The entire contents of each application are hereby incorporated herein by reference.

BACKGROUND OF THE INVENTION

1. Field of the Invention

The present invention relates to an antenna installation structure in which a planar antenna is installed on another member, and an electronic device including the antenna installation structure.

2. Description of the Related Art

Japanese Unexamined Patent Application Publication No. 2012-231386 discloses a communication device including an antenna substrate. In the communication device described in Japanese Unexamined Patent Application Publication No. 2012-231386, the antenna substrate is installed on one main surface of a housing. The antenna substrate includes a dielectric substrate and an antenna conductor formed on one surface of the dielectric substrate.

The surface of the antenna substrate on which the antenna conductor is formed is disposed parallel to the one main surface of the housing. The antenna substrate is installed in the housing such that the surface on which the antenna conductor is formed faces the housing.

As described in Japanese Unexamined Patent Application Publication No. 2012-231386, when the antenna substrate is installed in the housing, it is easy to use a double-sided tape for reasons such as easy temporary fixing and easy installation.

However, although it is easy to use a double-sided tape for fixing, there is a large difference, depending on the material of a double-sided tape, in the linear expansion coefficient between a double-sided tape and an antenna substrate, particularly between a double-sided tape and an antenna conductor of an antenna substrate. Accordingly, when a double-sided tape is cured, stress is applied to an antenna conductor, and the antenna conductor may be peeled off from a dielectric substrate.

SUMMARY OF THE INVENTION

Preferred embodiments of the present invention provide antenna installation structures in each of which peeling off of an antenna conductor is reduced or prevented.

An antenna installation structure according to a preferred embodiment of the present invention includes an antenna substrate, an insulation layer, and a bonding material. The antenna substrate includes a dielectric base including a first main surface and a second main surface, and an antenna conductor on the first main surface. The insulation layer is on the first main surface of the antenna substrate. The bonding material is between the insulation layer and another component, is cured, and bonds the insulation layer to the other component. The linear expansion coefficient of the insulation layer is less than the linear expansion coefficient of the bonding material and higher than the linear expansion coefficient of the antenna substrate.

With this configuration, the insulation layer with a linear expansion coefficient closer to that of the antenna substrate than that of the bonding material is disposed between the antenna substrate and the bonding material. With this, the difference in linear expansion coefficient at the interface of the antenna conductor disposing portion is small, and the antenna conductor does not easily peel off.

According to preferred embodiments of the present invention, it is possible to provide antenna installation structures in each of which peeling off of an antenna conductor is reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
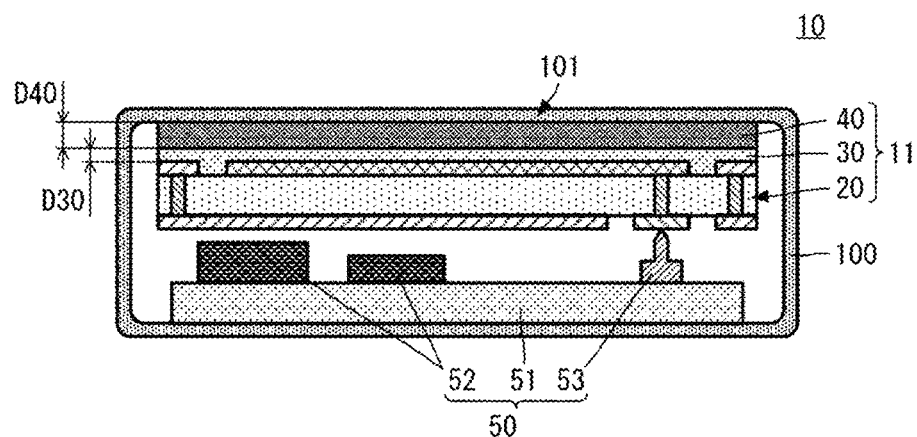
FIG. 1 is a side sectional view illustrating a configuration of an electronic device according to a first preferred embodiment of the present invention.
Figure 2A:
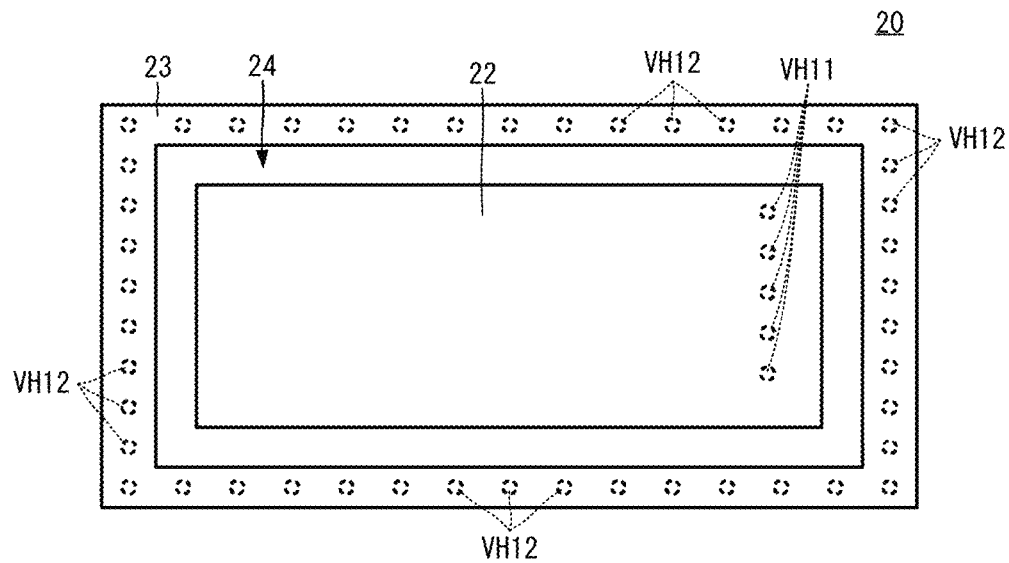
FIG. 2A is a first main surface view of an antenna substrate.
Figure 2B:
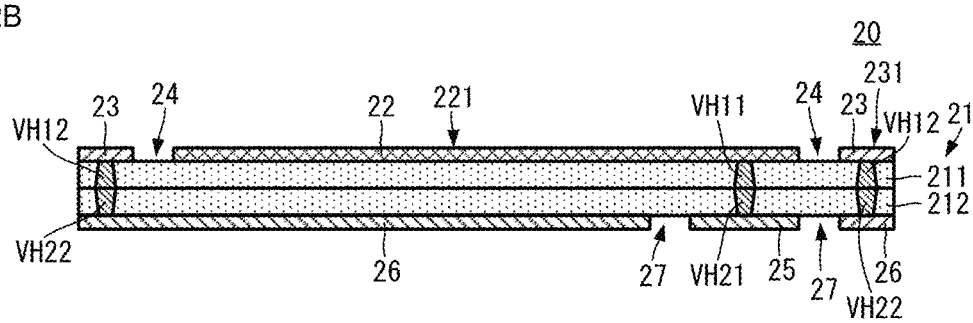
FIG. 2B is a side sectional view of the antenna substrate.
Figure 2C:
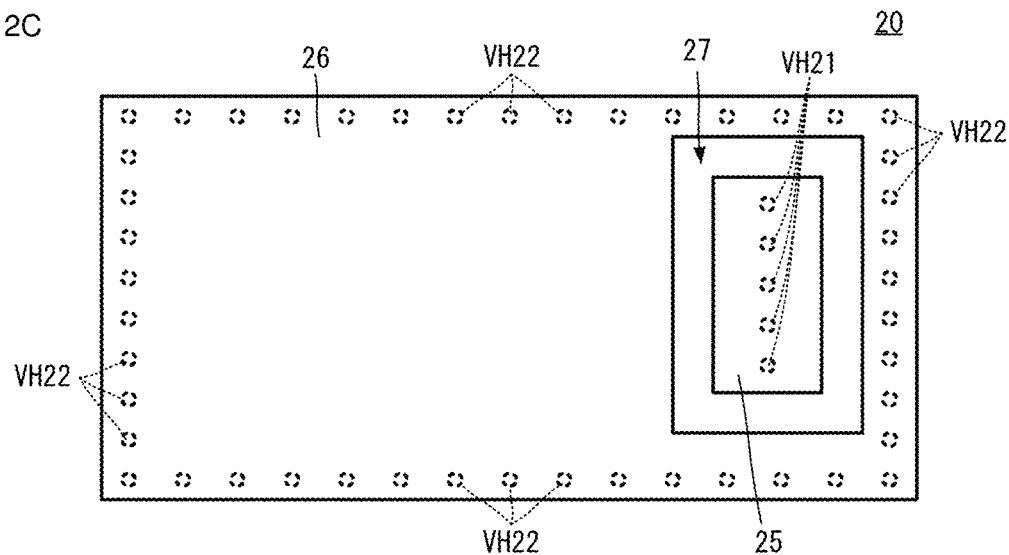
FIG. 2C is a second main surface view of the antenna substrate.

An antenna installation structure and an electronic device according to a first preferred embodiment of the present invention will be described with reference to the drawings. FIG. 1 is a side sectional view illustrating a configuration of an electronic device according to the first preferred embodiment. FIG. 2A is a first main surface view of the antenna substrate, FIG. 2B is a side sectional view of the antenna substrate, and FIG. 2C is a second main surface view of the antenna substrate. Dimensions or the like of elements and features in respective drawings, including those of other preferred embodiments, are appropriately emphasized to facilitate understanding of the description.

As illustrated in FIG. 1, an electronic device 10 includes an antenna substrate 20, an insulation layer 30, a bonding material 40, a circuit substrate 50, and a housing 100.

The housing 100 has a box shape and includes an internal space. The housing 100 includes a radiation side wall 101 with a predetermined area. A portion of the radiation side wall 101 of the housing 100 overlapping the antenna substrate 20 is made of a non-conductor. For example, this portion is made of a dielectric, an insulator, or the like.

The antenna substrate 20, the insulation layer 30, the bonding material 40, and the circuit substrate 50 are disposed in the internal space of the housing 100. The specific configuration of the antenna substrate 20 will be described later. The insulation layer 30 has a flat film shape and is made of an epoxy resin, for example. The bonding material 40 has a flat film shape and includes an acrylic resin (PMMA), for example.

The antenna substrate 20 is bonded to the inner wall surface of the radiation side wall 101 of the housing 100 with the bonding material 40 and the insulation layer 30 interposed therebetween. More specifically, the bonding material 40 in a flat film shape is in contact with the inner wall surface of the radiation side wall 101. The insulation layer 30 is in contact with the surface, which is opposite from the surface in contact with the radiation side wall 101, of the bonding material 40. The antenna substrate 20 is in contact with the surface, which is opposite from the surface in contact with the bonding material 40, of the insulation layer 30. In other words, the insulation layer 30 covers the entire or substantially the entire surface of the first main surface of the antenna substrate 20, and the bonding material 40 bonds, to the radiation side wall 101, the entire or substantially the entire surface of the insulation layer 30, which is opposite from the surface in contact with the antenna substrate 20. The antenna substrate 20, the insulation layer 30, and the bonding material 40 define an antenna installation structure 11.

The circuit substrate 50 is installed on a wall, which is opposite to the radiation side wall 101, of the housing 100, for example. The circuit substrate 50 includes a main substrate 51, an electronic component 52, and a pin connector 53. The electronic component 52 and the pin connector 53 are mounted on the main substrate 51. The circuit substrate 50 is connected to the antenna substrate 20 via the pin connector 53.

As illustrated in FIGS. 2A to 2C, the antenna substrate 20 includes a dielectric base member 21, an antenna conductor 22, a ground conductor 23, a separation portion 24, a connection conductor 25, a ground conductor 26, and a separation portion 27. The dielectric base member 21 is made of, for example, a material including as a main component a fluororesin, a liquid crystal polymer (LCP), or the like. The antenna conductor 22, the ground conductor 23, the connection conductor 25, and the ground conductor 26 are made of a metal, for example, and are preferably made of a material such as, for example, copper (Cu) having high conductivity and excellent workability.

The dielectric base member 21 preferably is formed by laminating a dielectric layer 211 and a dielectric layer 212 that have a flat film shape, and has a flat plate shape, for example. The surface of the dielectric layer 211 opposite from the surface in contact with the dielectric layer 212 is the first main surface of the dielectric base member 21 (first main surface of the antenna substrate 20), and the surface of the dielectric layer 212 opposite from the surface in contact with the dielectric layer 211 is the second main surface of the dielectric base member 21 (second main surface of the antenna substrate 20).

The antenna conductor 22 and the ground conductor 23 are disposed on the first main surface of the dielectric base member 21. The antenna conductor 22 has a rectangular or substantially rectangular shape in plan view. The ground conductor 23 has an annular or substantially annular shape in plan view, and is disposed outside the outer peripheral end of the antenna conductor 22. The ground conductor 23 is disposed along the outer periphery of the first main surface of the dielectric base member 21. The ground conductor 23 surrounds the entire or substantially the entire circumference of the antenna conductor 22. That is, the ground conductor 23 is disposed over the entire or substantially the entire outer periphery of the antenna conductor 22 with the separation portion 24, in which no conductor is provided, interposed therebetween. By providing the ground conductor 23, unnecessary electromagnetic field coupling on the side portion of the antenna conductor 22 may be reduced or prevented.

The connection conductor 25 and the ground conductor 26 are disposed on the second main surface of the dielectric base member 21. The connection conductor 25 has a rectangular or substantially rectangular shape in plan view. The connection conductor 25 has a smaller area than the antenna conductor 22, and overlaps the antenna conductor 22. The connection conductor 25 is connected to the antenna conductor 22 via an interlayer connection conductor VH21 formed in the dielectric layer 212 and an interlayer connection conductor VH11 provided in the dielectric layer 211. The pin connector 53 is connected to the connection conductor 25.

The ground conductor 26 has an annular or substantially annular shape in plan view, and is disposed outside the outer peripheral end of the connection conductor 25. The ground conductor 26 surrounds the entire or substantially the entire circumference of the connection conductor 25. That is, the ground conductor 26 is disposed over the entire or substantially the entire outer periphery of the connection conductor 25 with the separation portion 27, in which no conductor is provided, interposed therebetween. The ground conductor 26 is connected to the ground conductor 23 via an interlayer connection conductor VH22 provided in the dielectric layer 212 and the interlayer connection conductor VH12 provided in the dielectric layer 211.

Here, the antenna substrate 20, the insulation layer 30, and the bonding material 40 have a relationship with respect to linear expansion coefficient as described below. The linear expansion coefficient of the insulation layer 30 is higher than the linear expansion coefficient of the antenna substrate 20, in particular, higher than the linear expansion coefficient of the antenna conductor 22. Further, the linear expansion coefficient of the insulation layer 30 is lower than the linear expansion coefficient of the bonding material 40. Here, the linear expansion coefficient of the bonding material 40 includes both of the linear expansion coefficient before curing and the linear expansion coefficient after curing. Note that the linear expansion coefficient is the linear expansion coefficient in an in-plane direction.

The relative permittivity of the insulation layer 30 is preferably lower than the relative permittivity of the bonding material 40. With this, a change in antenna characteristics may be reduced or prevented. More preferably, the relative permittivity of the antenna substrate 20 (excluding the conductors) is lower than the relative permittivity of the insulation layer 30, and the relative permittivity of the insulation layer 30 is lower than the relative permittivity of the bonding material 40. This makes it possible to further reduce or prevent the change in antenna characteristics.

With such a configuration, the stress due to the difference in linear expansion coefficient applied to the interface between the antenna conductor 22 and the dielectric base member 21 is more greatly reduced or prevented than with the configuration in which the bonding material 40 is in direct contact with the antenna substrate 20. With this, peeling off of the antenna conductor 22 may be reduced or prevented with the antenna installation structure 11.

Further, in the antenna installation structure 11, preferably, the thickness D30 of the insulation layer 30 is smaller than the thickness D40 of the bonding material 40. With this, stress applied to the interface between the antenna conductor 22 and the dielectric base member 21 is further reduced or prevented, and peeling off of the antenna conductor 22 is further reduced or prevented. That is, the reliability of the antenna installation structure 11 is improved.

Further, in this configuration, the antenna substrate 20 includes an interlayer connection conductor that connects the ground conductor 23 and the ground conductor 26 and that extends in the thickness direction of the antenna substrate 20. With this, the strength of the antenna substrate 20 may be increased. In particular, the interlayer connection conductor that connects the ground conductor 23 and the ground conductor 26 is disposed along the outer periphery of the antenna substrate 20 and in the vicinity of this outer periphery. This makes it possible to increase the strength of the outer peripheral portion where a breakage is likely to occur. The strength of the antenna substrate 20, then, is increased, and the reliability of the antenna installation structure 11 is further improved.

Similarly, the antenna substrate 20 includes an interlayer connection conductor that connects the antenna conductor 22 and the connection conductor 25 and that extends in the thickness direction of the antenna substrate 20. With this, peeling off of the antenna conductor 22 in the antenna substrate is unlikely to occur, and the reliability of the antenna installation structure 11 is further improved.

The electronic device 10 having this configuration is manufactured with the following non-limiting example of a manufacturing method.

First, the dielectric layer 211 on which the antenna conductor 22 and the ground conductor 23 are provided, and the dielectric layer 212 on which the connection conductor 25 and the ground conductor 26 are provided are laminated. At this time, in the dielectric layer 211, a conductive paste defining and functioning as the base of the interlayer connection conductor VH11 and a conductive paste defining and functioning as the base of the interlayer connection conductor VH12 are formed. In the dielectric layer 212, a conductive paste defining and functioning as the base of an interlayer connection conductor VH21 and a conductive paste defining and functioning as the base of the interlayer connection conductor VH22 are formed. Then, the dielectric layer 211 and the dielectric layer 212 are laminated with the portion of the interlayer connection conductor VH11 and the portion of the interlayer connection conductor VH21 being overlapped with each other, and with the portion of the interlayer connection conductor VH12 and the portion of the interlayer connection conductor VH22 being overlapped with each other. Further, by pressure bonding of the laminated body with heat, the dielectric layers are bonded to each other, and the interlayer connection conductors are solidified. Thus, the dielectric base member 21 is formed, and the antenna substrate 20 is formed.

Next, a liquid resin material is applied to the first main surface of the antenna substrate 20, then heated and cured to form the insulation layer 30.

Next, the bonding material 40 such as, for example, a double-sided tape is temporarily fixed to the surface, which is opposite from the surface in contact with the antenna substrate 20, of the insulation layer 30. Thereafter, the antenna substrate to which the bonding material 40 is temporarily fixed is installed on the inner wall surface of the radiation side wall 101 of the housing 100. Then, the bonding material 40 is cured by heating the bonding material 40. Note that, the bonding material 40 may be temporarily fixed in advance to the inner wall surface of the radiation side wall 101 of the housing 100. With this, the antenna substrate 20 may be easily installed in the housing 100.

Thereafter, a portion of the housing 100 on which the circuit substrate 50 is installed is laid over another portion, which includes the radiation side wall 101, of the housing 100, such that the pin connector 53 is brought into contact with the connection conductor 25. With this, the electronic device 10 is formed.

Second Preferred Embodiment

Figure 3:
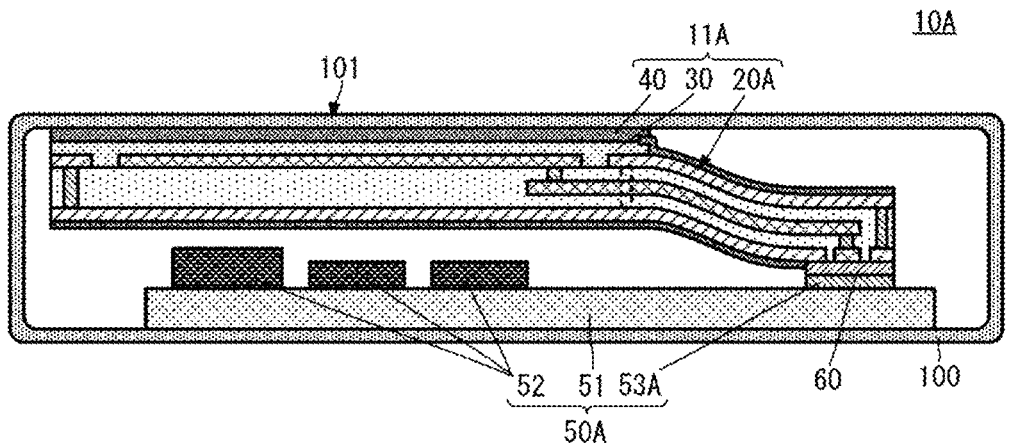
FIG. 3 is a side sectional view illustrating a configuration of an electronic device according to a second preferred embodiment of the present invention.
Figure 4:
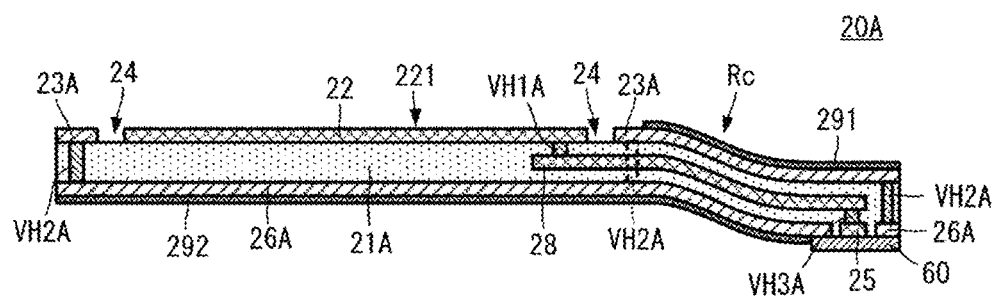
FIG. 4 is a side sectional view illustrating a configuration of an antenna substrate according to the second preferred embodiment of the present invention.

An antenna installation structure and an electronic device according to a second preferred embodiment of the present invention will be described with reference to the drawings. FIG. 3 is a side sectional view illustrating the configuration of the electronic device according to the second preferred embodiment. FIG. 4 is a side sectional view illustrating the configuration of the antenna substrate according to the second preferred embodiment.

As illustrated in FIG. 3 and FIG. 4, an electronic device 10A according to the second preferred embodiment is different from the electronic device 10 according to the first preferred embodiment in the configuration of an antenna substrate 20A. Other configurations of the electronic device 10A are the same or substantially the same as those of the electronic device 10, and description of the same or corresponding portions will be omitted.

The antenna substrate 20A includes a wiring conductor 28. The wiring conductor 28 is disposed in a predetermined layer between the first main surface and the second main surface of a dielectric base member 21A.

The wiring conductor 28 is a band-shaped (linear shape having a predetermined width) conductor. One end of the wiring conductor 28 in an extending direction overlaps the antenna conductor 22 in plan view (viewed in a direction orthogonal or substantially orthogonal to the first main surface). The one end of the wiring conductor 28 in the extending direction is connected to the antenna conductor 22 via an interlayer connection conductor VH1A. The other end of the wiring conductor 28 in the extending direction overlaps the connection conductor 25 in plan view. The other end of the wiring conductor 28 in the extending direction is connected to the connection conductor 25 via an interlayer connection conductor VH3A.

A ground conductor 23A and a ground conductor 26A are sandwich the wiring conductor 28 therebetween. The ground conductor 23A and the ground conductor 26A are connected by an interlayer connection conductor VH2A. With this, the antenna substrate 20A includes a strip line in a portion different from the antenna conductor 22.

In the region where the strip line is provided, the antenna substrate 20A includes a bent portion Rc. As illustrated in FIG. 3 and FIG. 4, the bent portion Rc has a structure in which the first main surface and the second main surface of the antenna substrate 20A are bent. The bent portion Rc is positioned between a portion where the insulation layer 30 is bonded to the radiation side wall 101 by the bonding material 40 and a portion where the bent portion Rc is connected to a connector 60. The bent portion Rc may easily be obtained by using the same material as that of the above-described dielectric base member 21 for the dielectric base member 21A, that is, by using a flexible material.

Also in such a configuration, with the electronic device 10A and an antenna installation structure 11A, peeling off of the antenna conductor may be reduced or prevented with the above-described antenna installation structure. Further, with this configuration, the flexibility of installation of the antenna substrate 20A with respect to a circuit substrate 50A is improved.

Further, the interlayer connection conductor VH2A is disposed at a portion, which surrounds the antenna conductor 22 and is close to the bent portion Rc, of the ground conductor 23A. With this, due to the residual stress generated in the bent portion Rc, it is possible to reduce or prevent peeling off or the like (such as the peeling off of the ground conductor 23A or the peeling off between layers, for example) of each element in the portion (antenna function portion) of the antenna conductor 22. In addition, it is possible to reduce or prevent a change in antenna characteristics, disconnection, or the like caused by the breakage above. As a result, the reliability of the electronic device 10A is improved.

In the second preferred embodiment, the antenna substrate 20A and the circuit substrate 50A are connected by the connector 60 mounted on the antenna substrate 20A and a connector 53A mounted on the circuit substrate 50A. However, the connection conductor 25 and the ground conductor 26A may be directly bonded to a land conductor (not illustrated) of the circuit substrate 50A by soldering or the like.

The antenna substrate 20A includes a coverlay 291 and a coverlay 292 that have an insulation property. The coverlay 291 covers the first main surface side of the antenna substrate 20A. The coverlay 291 is disposed in a region which does not overlap the antenna conductor 22 of the antenna substrate 20A. The coverlay 292 covers the second main surface side of the antenna substrate 20A. The coverlay 292 is disposed on the entire or substantially the entire surface of the antenna substrate 20A. With this configuration, the antenna substrate 20A is provided with the coverlay 291 and the coverlay 292 in the bent portion Rc. With the antenna substrate 20A, then, the ground conductor 23A and the ground conductor 26A may be protected in the bent portion Rc.

Further, as illustrated in FIG. 3, in the antenna substrate 20A, the coverlay 291 and the insulation layer 30 overlap each other at the end portion, toward the antenna conductor 22, of the bent portion Rc. With this, peeling off due to the above-described residual stress may be further reduced or prevented with the antenna substrate 20A.

Further, the bent portion Rc does not overlap the insulation layer 30 and the bonding material 40 in plan view of the first main surface. With this, the propagation of the stress generated in the bent portion Rc to the bonding material 40 is reduced or prevented. As a result, deviation of the antenna characteristics from the desired characteristics is reduced or prevented.

Third Preferred Embodiment

Figure 5:
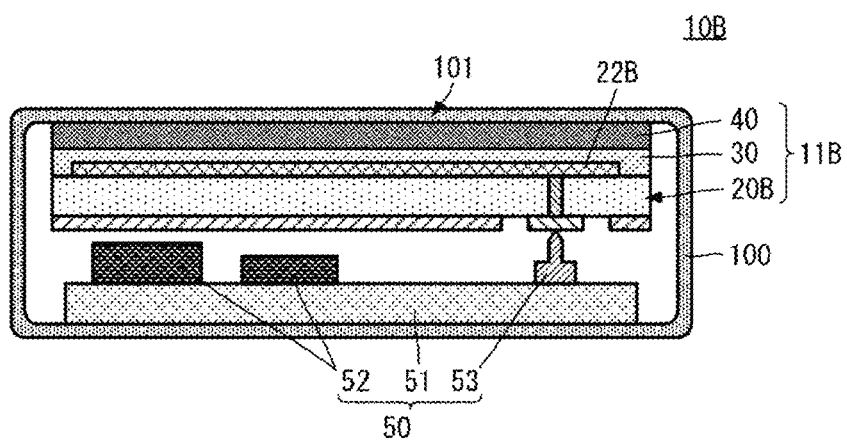
FIG. 5 is a side sectional view illustrating a configuration of an electronic device according to a third preferred embodiment of the present invention.

An antenna installation structure and an electronic device according to a third preferred embodiment of the present invention will be described with reference to the drawings. FIG. 5 is a side sectional view illustrating the configuration of the electronic device according to the third preferred embodiment.

As illustrated in FIG. 5, an antenna installation structure 11B and an electronic device 10B according to the third preferred embodiment are different from the antenna installation structure 11 and the electronic device 10 according to the first preferred embodiment in that the ground conductor 23 is not included. Other configurations of the antenna installation structure 11B and the electronic device 10B are the same or substantially the same as those of the antenna installation structure 11 and the electronic device 10 according to the first preferred embodiment, and the description of the same or corresponding portions will be omitted.

The antenna installation structure 11B includes an antenna substrate 20B. The antenna substrate 20B includes only an antenna conductor 22B on the first main surface and does not include a ground conductor. The insulation layer 30 covers the antenna conductor 22B and the first main surface so as to overlap the entire or substantially the entire first main surface in plan view of the first main surface.

As described above, even in the configuration in which the ground conductor surrounding the antenna conductor is not provided, peeling off of the antenna conductor 22B may be reduced or prevented with the antenna installation structure 11B, as in the case with the antenna installation structure 11.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An antenna installation structure, comprising:
an antenna substrate including a dielectric base including a first main surface and a second main surface, and an antenna conductor on the first main surface;
an insulation layer on the first main surface of the antenna substrate; and
a bonding material between the insulation layer and another component and bonding the insulation layer to the other component; wherein
a linear expansion coefficient of the insulation layer is lower than a linear expansion coefficient of the bonding material and is higher than a linear expansion coefficient of the antenna substrate.

2. The antenna installation structure according to claim 1, wherein the bonding material is cured.

3. The antenna installation structure according to claim 1, wherein a thickness of the insulation layer is smaller than a thickness of the bonding material.

4. The antenna installation structure according to claim 1, wherein the bonding material is cured by heat.

5. The antenna installation structure according to claim 1, wherein the bonding material includes an acrylic resin.

6. The antenna installation structure according to claim 1, wherein the insulation layer covers the antenna conductor and the first main surface such that the insulation layer overlaps an entirety or substantially an entirety of the first main surface in plan view of the first main surface.

7. The antenna installation structure according to claim 1, wherein the antenna substrate includes, in the dielectric base, an interlayer connection conductor to connect an antenna to the antenna conductor.

8. The antenna installation structure according to claim 1, wherein the antenna substrate includes a ground conductor outside an outer peripheral end of the antenna conductor and surrounds the antenna conductor.

9. The antenna installation structure according to claim 7, wherein the antenna substrate includes, in the dielectric base, an interlayer connection conductor to connect a ground to the ground conductor.

10. The antenna installation structure according to claim 1, wherein the antenna substrate includes a bent portion in a portion to be bonded to the bonding material via the insulation layer, and in another portion.

11. The antenna installation structure according to claim 1, wherein a relative permittivity of the insulation layer is lower than a relative permittivity of the bonding material.

12. The antenna installation structure according to claim 10, wherein a relative permittivity of the antenna substrate is lower than the relative permittivity of the insulation layer.

13. An electronic device, comprising:
the antenna installation structure according to claim 1; and
a circuit substrate to be connected to the antenna substrate; wherein
the other component is a housing that houses the antenna substrate and the circuit substrate.

14. The electronic device according to claim 13, wherein the bonding material is cured.

15. The electronic device according to claim 13, wherein a thickness of the insulation layer is smaller than a thickness of the bonding material.

16. The electronic device according to claim 13, wherein the bonding material is cured by heat.

17. The electronic device according to claim 13, wherein the bonding material includes an acrylic resin.

18. The electronic device according to claim 13, wherein the insulation layer covers the antenna conductor and the first main surface such that the insulation layer overlaps an entirety or substantially an entirety of the first main surface in plan view of the first main surface.

19. The electronic device according to claim 13, wherein the antenna substrate includes, in the dielectric base, an interlayer connection conductor to connect an antenna to the antenna conductor.

20. The electronic device according to claim 13, wherein the antenna substrate includes a ground conductor outside an outer peripheral end of the antenna conductor and surrounds the antenna conductor.

* * * * *